(12) United States Patent
Ohshige

(10) Patent No.: US 7,216,325 B2
(45) Date of Patent: May 8, 2007

(54) SEMICONDUCTOR DEVICE, ROUTING METHOD AND MANUFACTURING METHOD OF SEMICONDUCTOR DEVICE

(75) Inventor: Shinichiro Ohshige, Kanagawa (JP)

(73) Assignee: NEC Electronics Corporation, Kanagawa (JP)

(*) Notice: Subject to any disclaimer, the term of this patent is extended or adjusted under 35 U.S.C. 154(b) by 321 days.

(21) Appl. No.: 10/960,720

(22) Filed: Oct. 8, 2004

(65) Prior Publication Data
US 2005/0081176 A1 Apr. 14, 2005

(30) Foreign Application Priority Data
Oct. 9, 2003 (JP) ............................. 2003-351300

(51) Int. Cl.
*G06F 17/50* (2006.01)
(52) U.S. Cl. ............................. 716/12; 716/13; 716/14
(58) Field of Classification Search ............. 716/11–14
See application file for complete search history.

(56) References Cited

U.S. PATENT DOCUMENTS 6,505,333 B1 * 1/2003 Tanaka ........................ 716/13
6,539,530 B1 * 3/2003 Torii ............................ 716/12
6,732,345 B2 5/2004 Kato
6,957,411 B1 * 10/2005 Teig et al. .................... 716/13
7,065,729 B1 * 6/2006 Chapman ..................... 716/13

FOREIGN PATENT DOCUMENTS

JP 3390393 B2 3/2003

* cited by examiner

*Primary Examiner*—Paul Dinh
(74) *Attorney, Agent, or Firm*—Foley & Lardner LLP

(57) ABSTRACT

A routing method of a semiconductor device includes steps (a) to (c). The step (a) checks a relation between a first interconnection pattern to be routed and a second interconnection pattern to be routed, wherein a line width of the second interconnection pattern is thicker than that of the first interconnection pattern. The step (b) refers to a routing rule of a design rule corresponding to a connection between the first interconnection pattern and the second interconnection pattern, when the first interconnection pattern and the second interconnection pattern would be routed in a same layer and connected each other. The step (c) routes the first interconnection pattern and the second interconnection such that the first interconnection is not bent in an area defined based on the routing rule.

3 Claims, 7 Drawing Sheets

SEMICONDUCTOR DEVICE, ROUTING METHOD AND MANUFACTURING METHOD OF SEMICONDUCTOR DEVICE

BACKGROUND OF THE INVENTION

1. Field of the Invention

The present invention relates to a semiconductor device, a routing method and manufacturing method of a semiconductor device. More particularly, the present invention relates to a semiconductor device in which interconnections can be routed properly, a routing method and manufacturing method of a semiconductor device which can route interconnections of the semiconductor device properly.

2. Description of the Related Art

In the layout design of a large scale integrated circuit (LSI), a placement and routing system is known, which automatically places logic cells and logic blocks (hereinafter referred to as logic cells/blocks) and routes interconnections (for example, Japanese Patent 3390393). The placement and routing system is exemplified in a CAD (Computer Aided Design) system. The placement and routing operation for using the placement and routing system is carried out, for example, as follows. At first, it reads the data with regard to the circuit diagram of a LSI of a design target, the data of logic cells/blocks prepared in a library, and the data with regard to a design rule. Next, it places the logic cells/blocks, based on the respective read data. Then, it routes interconnections among the placed logic cells/blocks based on the respective read data. After that, it verifies whether or not there is any trouble in the placement and routing, and carries out the re-placement and the re-routing if necessary. Finally, it generates the artwork data with regard to the routing of the entire chip corresponding to patterns in respective layers constituting the LSI based on the data of the placement and routing system.

Those, which are automatically placed and routed, are exemplified in followings. Those are: a thin interconnection, a thick interconnection and a macro (logic cells/blocks). The thin interconnection is thin in line width and exemplified in a signal interconnection. The thick interconnection is thicker in line width than the thin interconnection and exemplified in a power supply interconnection and a ground interconnection. The macro (logic cells/blocks) is exemplified in a memory. Here, a case of connecting the thin interconnection and a thick width figure is explained as an example. The thick width figure has a thick width as compared with the thin interconnection such as the macro and the thick interconnection.

FIG. 1 is an example of a layout view showing the connection between the thin interconnection and the thick width figure in the conventional placement and routing. Along grid lines 121 in an X-direction and grid lines 122 in a Y-direction, an interconnection A 111 and an interconnection B112 are respectively routed. One end of the interconnection A 111 (interconnections A 111-1 to 111-3) is connected to one end of s thick width FIG. 115. Around the thick width FIG. 115, a thick width spacing area 117 is provided based on the design rule.

The interconnection A 111 is routed in the vicinity of the portion connected to the thick width FIG. 115, based on the predetermined design rule. The design rule is the minimum spacing rule. The rule is that a interconnection (111) is bent at the position away from the thick width FIG. (115) by a minimum spacing (119) or more, when the interconnection (111) connected to the thick width FIG. (115) is bent in the same layer as the thick width FIG. (115). This minimum spacing rule, for example, enables the protection against the influence of microloading effect.

Here, the microloading effect implies the phenomenon of the etching trouble in the photolithography. The phenomenon is caused by a fact that an etching manner is different depending on a position, when a pattern having a high density and a pattern having a low density are etched at the same time. In the example of FIG. 1, such effect easily occurs in the connection portion between the thick width FIG. 115 and the interconnection A 111. For this reason, the minimum spacing rule is applied.

In the case of FIG. 1 in the routing, after the interconnection A 111 is routed as close as possible to the thick width FIG. 115, both are connected to each other. For this reason, the bent point is inevitably located at the distance of the minimum spacing 119. Then, the interconnections A 111-1 to A 111-2 connected to the thick width FIG. 115 are placed within a predetermined distance Y defined from the connection portion (the predetermined distance Y>the minimum spacing 119). In such a case, under the design rule, the minimum spacing rule of the thick width FIG. 115 is applied to the interconnections A 111-1 to A 111-2. That is, the thick width spacing area 117 for the thick width FIG. 115 is also enlarged around the interconnections A 111-1 to A 111-2.

A interconnection B 112 can not enter the thick width spacing area 117 because of the design rule. For this reason, the interconnection B 112 is routed along grid lines Tx5-Ty1-Tx6-Ty6-Tx5. That is, the interconnection B 112 is routed so as to make a detour around the thick width spacing area 117, in the vicinity of the connection portion to the thick width FIG. 115. Thus, the interconnection B 112 is routed so as to make the detour around the interconnection A 111-2, although there is no problem on the design even if it is routed only on the grid line Tx5. Consequently, not only the routing resource (routing region) is reduced, but also the interconnection length becomes long.

Thus, in the connection portion between the thick width FIG. 115 and the interconnection A 111, there may be a possibility that the thick width spacing area 117 is wider than necessary. A technique is required for suitably setting a region to regulate the routing in the connection portion between the thick width figure and the thin interconnection. A technique is desired for suitably setting the interconnection laid in the vicinity of the connection region between the thick width figure and the thin interconnection. And, a technique is desired for suitably setting the routing region in the vicinity of the connection region between the thick width figure and the thin interconnection and protecting the interconnection length from being longer than necessary.

In the above-mentioned Japanese Patent No. 3390393, a routing method of a placement and routing system is disclosed. The routing method of a placement and routing system routs interconnections on grids with a predetermined pitch. Via cells are registered in a library and includes a rectangular via, a lower interconnection layer and an upper interconnection layer covering the rectangular via. The routing method includes the steps of: detecting that a spacing between interconnection is less than the minimum spacing with no limitation of facing interconnection length, and equal to or more than the short run spacing allowing a certain spacing with a certain limitation of facing interconnection length when the via cells are placed on adjacent grids facing each other; generating the via cell data modifying the via margin such that the spacing can satisfy the minimum spacing with no limitation of facing interconnection length when via cells are placed in facing each other; and replacing the via cell data to the artwork data corresponding to the via cell after placing and routing by the placement and routing system based on the via cell data.

SUMMARY OF THE INVENTION

Therefore, an object of the present invention is to provide a routing method and manufacturing method of a semiconductor device, each of which suitably sets the region to regulate the interconnection in the connection portion between the thick width figure and the thin interconnection, without any reduction in reliability and stability, and a semiconductor device manufactured by using the routing method and manufacturing method of a semiconductor device.

Another object of the present invention is to provide a routing method and manufacturing method of a semiconductor device, each of which suitably sets the interconnection laid in the vicinity of the connection region between the thick width figure and the thin interconnection, without any reduction in reliability and stability, and a semiconductor device manufactured by using the routing method and manufacturing method of a semiconductor device.

Still another object of the present invention is to provide a routing method and manufacturing method of a semiconductor device, each of which suitably reserves the routing region in the vicinity of the connection region between the thick width figure and the thin interconnection, without any reduction in reliability and stability, and protects the interconnection length from being longer than necessary, and a semiconductor device manufactured by using the routing method and manufacturing method of a semiconductor device.

Yet still another object of the present invention is to provide a routing method and manufacturing method of a semiconductor device, each of which can increase a interconnection density and reduce a chip area, without any drop in reliability and stability, and a semiconductor device manufactured by using the routing method and manufacturing method of a semiconductor device.

This and other objects, features and advantages of the present invention will be readily ascertained by referring to the following description and drawings.

In order to achieve an aspect of the present invention, the present invention provides a routing method of a semiconductor device, including: (a) checking a relation between a first interconnection pattern to be routed and a second interconnection pattern to be routed, wherein a line width of the second interconnection pattern is thicker than that of the first interconnection pattern; (b) referring to a routing rule of a design rule corresponding to a connection between the first interconnection pattern and the second interconnection pattern, when the first interconnection pattern and the second interconnection pattern would be routed in a same layer and connected each other; and (c) routing the first interconnection pattern and the second interconnection such that the first interconnection is not bent in an area defined based on the routing rule.

In the routing method of a semiconductor device, the routing rule is a rule that a thin interconnection pattern is restricted to have a bending portion within a first distance from an edge of a thick interconnection pattern. A line width of the thick interconnection pattern is thicker than that of the thin interconnection pattern. The thin interconnection pattern is connected with the edge of the thick interconnection pattern.

In the routing method of a semiconductor device, the first distance is a spacing for an extension from the thick interconnection pattern.

In order to achieve an aspect of the present invention, the present invention provides a routing method of a semiconductor device, including: (d) routing a first interconnection pattern and a second interconnection pattern, wherein a line width of the second interconnection is thicker than that of the first interconnection pattern; (e) checking whether or not the first interconnection pattern is connected with the second interconnection pattern in a layer where the second interconnection is routed; (f) checking whether or not the first interconnection pattern is bent in an area defined based on a routing rule of a design rule; and (g) rerouting the first interconnection pattern based on the routing rule such that the first interconnection pattern is not bent in the area.

In the routing method of a semiconductor device, the routing rule is a rule that a thin interconnection pattern is restricted to have a bending portion within a first distance from an edge of a thick interconnection pattern. A line width of the thick interconnection pattern is thicker than that of the thin interconnection pattern. The thin interconnection pattern is connected with the edge of the thick interconnection pattern.

In the routing method of a semiconductor device, the first distance is a spacing for an extension from the thick interconnection pattern.

In order to achieve another aspect of the present invention, the present invention provides a computer program product embodied on a computer-readable medium and including code that, when executed, causes a computer to perform the following: (a) checking a relation between a first interconnection pattern to be routed and a second interconnection pattern to be routed, wherein a line width of the second interconnection pattern is thicker than that of the first interconnection pattern; (b) referring to a routing rule of a design rule corresponding to a connection between the first interconnection pattern and the second interconnection pattern, when the first interconnection pattern and the second interconnection pattern would be routed in a same layer and connected each other; and (c) routing the first interconnection pattern and the second interconnection such that the first interconnection is not bent in an area defined based on the routing rule.

In the computer program product, the routing rule is a rule that a thin interconnection pattern is restricted to have a bending portion within a first distance from an edge of a thick interconnection pattern. A line width of the thick interconnection pattern is thicker than that of the thin interconnection pattern. The thin interconnection pattern is connected with the edge of the thick interconnection pattern.

In the computer program product, the first distance is a spacing for an extension from the thick interconnection pattern.

In order to achieve another aspect of the present invention, the present invention provides a computer program product embodied on a computer-readable medium and including code that, when executed, causes a computer to perform the following: (d) routing a first interconnection pattern and a second interconnection pattern, wherein a line width of the second interconnection is thicker than that of the first interconnection pattern; (e) checking whether or not the first interconnection pattern is connected with the second interconnection pattern in a layer where the second interconnection is routed; (f) checking whether or not the first interconnection pattern is bent in an area defined based on a routing rule of a design rule; and (g) rerouting the first interconnection pattern based on the routing rule such that the first interconnection pattern is not bent in the area.

In the computer program product, the routing rule is a rule that a thin interconnection pattern is restricted to have a bending portion within a first distance from an edge of a thick interconnection pattern. A line width of the thick interconnection pattern is thicker than that of the thin interconnection pattern. The thin interconnection pattern is connected with the edge of the thick interconnection pattern.

In the computer program product, the first distance is a spacing for an extension from the thick interconnection pattern.

In order to achieve still another aspect of the present invention, the present invention provides a manufacturing method of a semiconductor device, including: (h) placing logic cells of a first semiconductor device based on circuit diagram data, logic cell/block data and design rule data; (i) routing interconnections of the first semiconductor device based on a routing method of a semiconductor device; (j) accomplishing a layout design of the first semiconductor device by checking the logic cells and the interconnections; and (k) exposing a resist film covering a film on a semiconductor substrate to light through a mask prepared based on the layout design. The routing method of a semiconductor device, includes: (l) checking a relation between a first interconnection pattern to be routed and a second interconnection pattern to be routed, wherein a line width of the second interconnection pattern is thicker than that of the first interconnection pattern, (m) referring to a routing rule of a design rule corresponding to a connection between the first interconnection pattern and the second interconnection pattern, when the first interconnection pattern and the second interconnection pattern would be routed in a same layer and connected each other, and (n) routing the first interconnection pattern and the second interconnection such that the first interconnection is not bent in an area defined based on the routing rule.

In the manufacturing method of a semiconductor device, the routing rule is a rule that a thin interconnection pattern is restricted to have a bending portion within a first distance from an edge of a thick interconnection pattern. A line width of the thick interconnection pattern is thicker than that of the thin interconnection pattern. The thin interconnection pattern is connected with the edge of the thick interconnection pattern.

In the manufacturing method of a semiconductor device, the first distance is a spacing for an extension from the thick interconnection pattern.

In order to achieve still another aspect of the present invention, the present invention provides a manufacturing method of a semiconductor device, including: (o) placing logic cells of a first semiconductor device based on circuit diagram data, logic cell/block data and design rule data; (p) routing interconnections of the first semiconductor device based on a routing method of a semiconductor device; (q) accomplishing a layout design of the first semiconductor device by checking the logic cells and the interconnections; and (r) exposing a resist film covering a film on a semiconductor substrate to light through a mask prepared based on the layout design. The routing method of a semiconductor device, includes: (s) routing a first interconnection pattern and a second interconnection pattern, wherein a line width of the second interconnection is thicker than that of the first interconnection pattern, (t) checking whether or not the first interconnection pattern is connected with the second interconnection pattern in a layer where the second interconnection is routed, (u) checking whether or not the first inter- connection pattern is bent in an area defined based on a routing rule of a design rule, and (v) rerouting the first interconnection pattern based on the routing rule such that the first interconnection pattern is not bent in the area.

In the manufacturing method of a semiconductor device, the routing rule is a rule that a thin interconnection pattern is restricted to have a bending portion within a first distance from an edge of a thick interconnection pattern. A line width of the thick interconnection pattern is thicker than that of the thin interconnection pattern. The thin interconnection pattern is connected with the edge of the thick interconnection pattern.

In the manufacturing method of a semiconductor device, the first distance is a spacing for an extension from the thick interconnection pattern.

In order to achieve yet still another aspect of the present invention, the present invention provides a semiconductor device including a first thin interconnection pattern and a thick interconnection pattern. The thick interconnection pattern is connected with the first thin interconnection pattern at an edge of the thick interconnection pattern. A line width of the thick interconnection pattern is thicker than that of the first thin interconnection pattern. The first interconnection pattern and the second interconnection pattern is routed in a same layer. The first thin interconnection pattern has a bending portion beyond a first distance from the edge.

The semiconductor device further includes a second thin interconnection pattern which is extended to a direction parallel to the thick interconnection pattern. The second thin interconnection pattern is routed on the nearest one of grid lines to the thick interconnection pattern. The grid lines are predetermined for routing interconnections. The second thin interconnection pattern is not detoured around an area corresponding to the edge and the bending portion.

In the semiconductor device, the first distance is a spacing for an extension from the thick interconnection pattern.

DESCRIPTION OF THE PREFERRED EMBODIMENTS

Embodiments of a semiconductor device, a routing method and manufacturing method of a semiconductor device according to the present invention will be described below with reference to the attached drawings.

At first, a configuration of a placement and routing system in the embodiment, to which the routing method of a semiconductor device of the present invention is applied, will be described with reference to the attached drawings.

Figure 2:
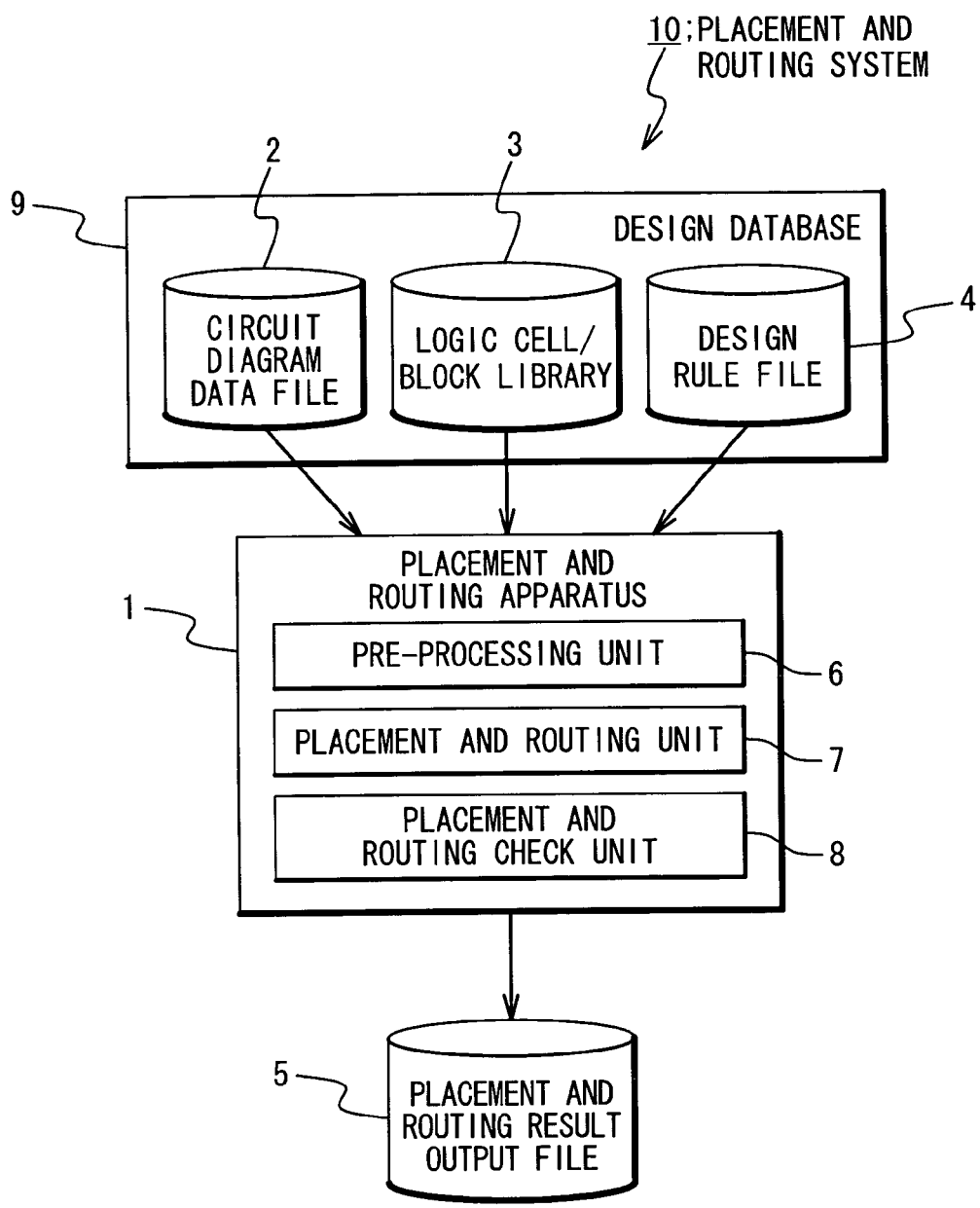
FIG. 2 is a view showing the configuration of the placement and routing system in this embodiment of the present invention.

FIG. 2 is a view showing the configuration of the placement and routing system in this embodiment. The placement and routing system 10 includes a placement and routing apparatus 1 and a design database 9.

The design database 9 is an information processor exemplified in a workstation and a personal computer. It includes a circuit diagram data file 2, a logic cell/block library 3 and a design rule file 4, as data and computer program related to the data. The circuit diagram data file 2 includes the connection data indicating the connection relation between the terminals of respective logic cells/blocks constituting LSI of a design target. The logic cell/block library 3 includes the data with regard to the logic cells, such as a via and a NAND gate, and the data with regard to the logic blocks to realize complex logic functions such as a memory macro. The design rule file 4 includes the design rule which is used in placing and routing, and in checking and verifying, such as the routing pitch in each interconnection layer, the interconnection width and the minimum spacing, and the dimensions of the respective components constituting a via cell. The routing rule with regard to the present invention is stored in the design rule file 4.

The placement and routing apparatus 1 is the information processor exemplified in a workstation and a personal computer. It includes a pre-processing unit 6, a placement and routing unit 7 and a placement and routing check unit 8, as a computer program. The placement and routing apparatus 1 and the design database 9 are communicably connected. Both of them may be integrated into one unit, from the viewpoints of the simplification of the system, the space saving and cost saving thereof.

The pre-processing unit 6 reads the connection data between the terminals of the respective cells/blocks constituting the design target LSI, from the circuit diagram data file 2. In addition, it reads the artwork data with regard to the logic cells/blocks used in the design target LSI, from the logic cell/block library 3. Moreover, it reads the design rule which is used in placing and routing, and in checking and verifying, such as the routing pitch in each interconnection layer, the interconnection width and the minimum spacing, and the dimensions of the respective components constituting a via cell. The design rule includes the routing rule with regard to the present invention.

The placement and routing unit 7 prepares the data for placement and routing based on the read data, and executes the placement and routing. At this time, the routing rule with regard to the present invention is applied to the placement and routing. Then, the placement and routing unit 7 outputs the executed results of the placement and routing to the placement and routing check unit 8.

The placement and routing check unit 8 checks and verifies the executed results of the placement and routing. At the time of the verification (checking), the routing rule with regard to the present invention may be used. If it does not find any trouble or defect, after converting the executed results of the placement and routing into the artwork data, it outputs the artwork data as a placement and routing result output file 5. If it finds the trouble or defect, the modification of the trouble (defect) point and the re-execution of the placement and routing are carried out by the placement and routing check unit 8 or an input/edit unit (not shown). Then, the verification (checking) is again executed.

Figure 3:
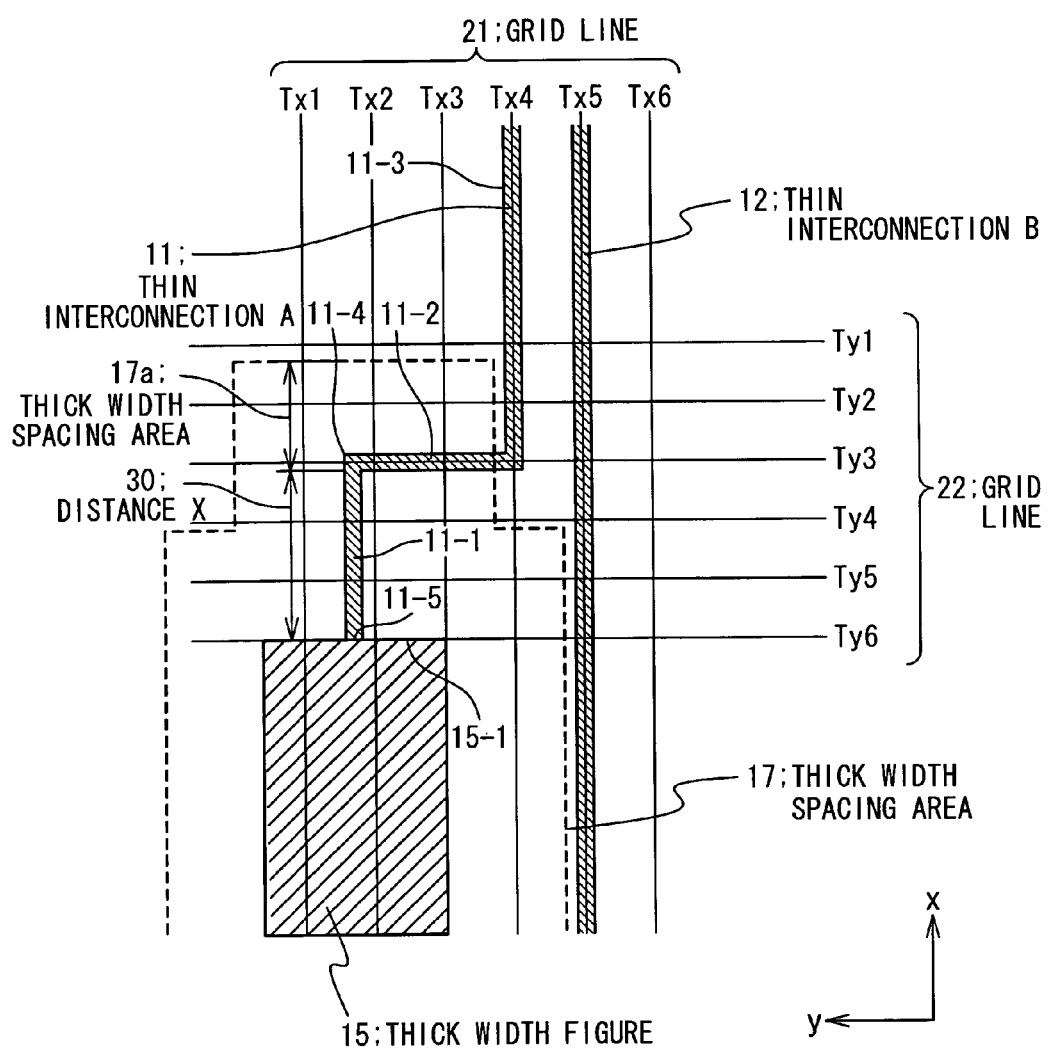
FIG. 3 is an example of a layout diagram of a semiconductor device to which the routing method of a semiconductor device of the present invention is applied.

FIG. 3 is an example of a layout diagram of a semiconductor device to which the routing method of a semiconductor device of the present invention is applied. FIG. 3 shows the connection portion between a thick width FIG. 15 and a thin interconnection A 11, in which the present invention is applied to the case of FIG. 1 (the thick width FIG. 115 and the thin interconnection A 111). The thin interconnection A 11 and a thin interconnection B 12 are routed, respectively, along one of grid lines 21 in an X-direction and one of grid lines 22 in a Y-direction. The thin interconnection A 11 includes a thin interconnections A 11-1 to 11-3, a bent point 11-4 and a connection point 11-5. The thin interconnection A 11 is connected to an edge point 15-1 of the thick width FIG. 15 at the connection point 11-5. A thick width spacing area 17 based on the design rule is reserved around the thick width FIG. 15. The thick width spacing area 17 is enlarged by the amount corresponding to a thick width spacing 17a beyond the bent point 11-4, on the side of the edge point 15-1.

Here, the line width of the thin interconnection A 11 and the thin interconnection B 12 is thinner than that of the thick width FIG. 15. The thin interconnection A 11 and the interconnection B 12 are exemplified in a signal interconnection. The thick width FIG. 15 is exemplified in a power supply interconnection and a ground interconnection. The thick width FIG. 15 may be exemplified in a macro (a logic cell/block) such as a memory and its terminals. The width of the thick width FIG. 15 is equal to several times to several ten times the width of the thin interconnection.

The thin interconnection A 11 is routed in the vicinity of the connection portion to the thick width FIG. 15, based on the predetermined design rule (the routing rule). The routing rule indicates that when a thin interconnection (11) connected to a thick width FIG. (15) is bent in the same layer as that the thick width FIG. (15) is in, the bent point (11-4) is placed at the position away from the edge point (15-1) of the thick width FIG. (15) by a predetermined distance X (30) or more. In this case, the portion from the bent point (11-4) to the connection point (11-5) in the thin interconnection (11-1) becomes straight.

Figure 1:
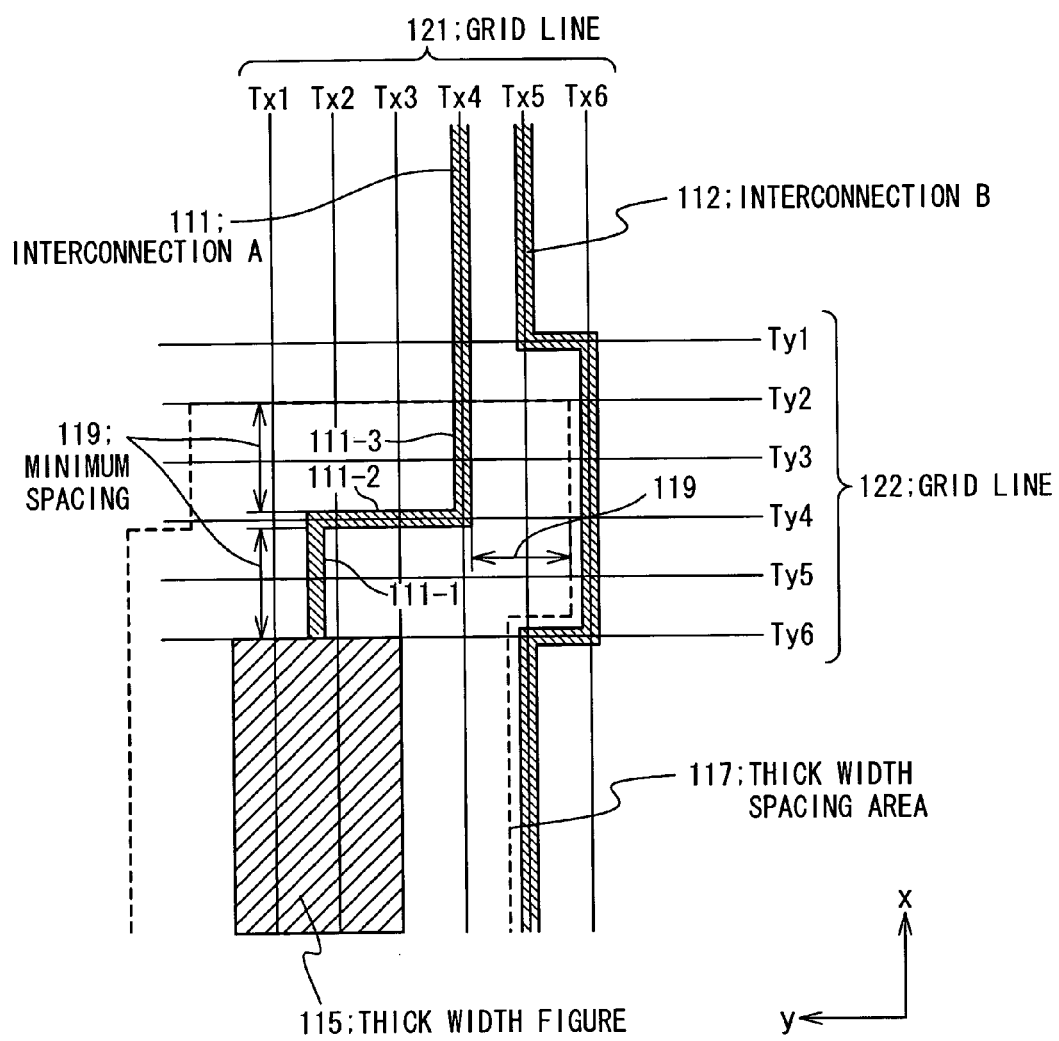
FIG. 1 is an example of a layout view showing the connection between the thin interconnection and the thick width figure in the conventional placement and routing.

Such the routing rule is effective for the case that the minimum spacing rule of the thick width FIG. 115 is applied to the thin interconnections A 111-1 to 111-2 in FIG. 1. That is, it is desired to be applied to the case of using such the minimum spacing rule as the design rule and carrying out the placement and routing. For example, this is the case that the interconnections are composed of copper.

As the predetermined distance X 30, the value can be used which is known as "Spacing with regard to an extension from a thick width figure" on the design rule. This value implies the way (length) from the connection point (11-5) of the thin interconnection (11) when the thin interconnection (11) extends from the thick width FIG. (15). If the thin interconnection extends from the thick width figure beyond the value, the minimum spacing rule is not applied to the thin interconnection. Usually, this value is used not as the (straight) distance but as the way (length, journey). There may be a bent portion in the middle of the way. However, in the case of this embodiment, if there is the bent portion in the middle, this is not desirable because the thick width spacing area 17 is enlarged on the side of the thin interconnection B 12, as shown in the case of FIG. 1. Therefore, the thin interconnection A 11-1 is defined as the straight line having the predetermined distance X 30 or more. Consequently, the minimum spacing rule of the thick width FIG. 15 is not applied to the thin interconnection A 11-1 so that the thick width spacing area 17 is never enlarged more than a necessary area. Thus, the routing resource (routing region) is not reduced, and the interconnection length is never longer than a necessary length.

However, if it has no influence on the thick width spacing area 17 (for example, if the thick width FIG. 15 is relatively much larger than the thin interconnection A 11), there is no problem even though there is the bent potion in the middle.

In this case, under the design rule, the minimum spacing rule of the thick width FIG. 15 is not applied to the thin interconnections A 11-1 to 11-2. That is, the thick width spacing area 17 for the thick width FIG. 15 is not enlarged around the thin interconnections A 11-1 to 11-2. Then, the thick width spacing area 17 belongs to the range less than the predetermined distance X 30 (the extension distance: the spacing with regard to an extension from the thick width figure) from the edge point 15-1, on the side of the edge point 15-1. That is, as compared with the conventional case (FIG. 1), the range of the thick width spacing area 17 can be made narrow, on the side of the edge point 15-1. The thin interconnection A 11 is routed so as not to have the bent point 11-4 in the range, under the routing rule.

The thin interconnection B 12 can not enter the thick width spacing area 17, under the design rule. The thin interconnection B 12 is routed on the grid line Tx5, so that it satisfies the minimum spacing rule and it does not enter the thick width spacing area 17. That is, the thin interconnection B 12 does not need to take the route (Tx5-Ty1-Tx6-Ty6-Tx5) such as the detour in the conventional case (FIG. 1). Thus, as compared with the conventional case (FIG. 1), the routing resource (routing region) is increased and the interconnection length is also made short.

Consequently, without any bad influence on the reliabilities and stabilities of the thin interconnections A 11, A 12, B 12 and thick width FIG. 15, the routing resource (routing region) can be enlarged as compared with the case of FIG. 1. Then, it is possible to protect the length of the thin interconnections from being longer than necessary, and increase the interconnection density and further reduce the chip area.

The thick width spacing area 17 is equal to several times to several ten times the region occupied by the usual routing. According to the present invention, the thick width spacing area 17 can be suppressed, thereby removing the detour routing corresponding to the suppressed region.

The embodiment of the routing method of a semiconductor device in the present invention (the operation of the placement and routing system) will be described below with reference to the attached drawings.

Figure 4:
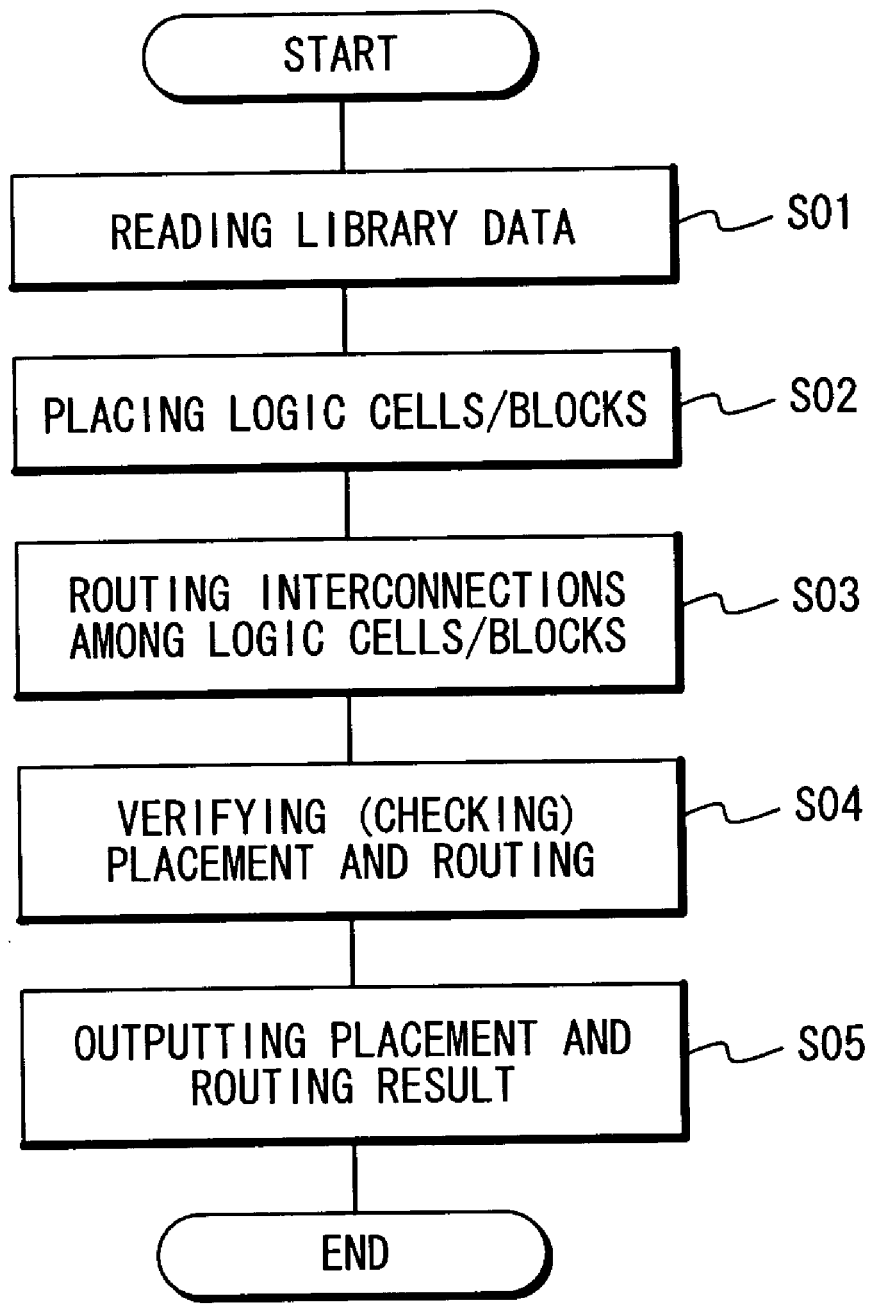
FIG. 4 is a flowchart showing the embodiment of the routing method of a semiconductor device in the present invention.

FIG. 4 is a flowchart showing the embodiment of the routing method of a semiconductor device in the present invention.

(1) Step S01: Reading Library Data

The pre-processing unit 6 reads the data from the circuit diagram data file 2, the logic cell/block library 3 and the design rule file 4. The data are related to the circuit diagram, the connection relation between the terminals, the logic cells/blocks to be placed, the routing pitch, the interconnection width, the minimum spacing between the interconnections, the side length of the via, the dimensions of the respective components constituting the via cell, the routing rule with regard to the present invention, and the like. Then, the pre-processing unit 6 sets the rule for the placement and routing.

(2) Step S02: Placing Logic Cells/Blocks

The placement and routing unit 7 automatically places primitive cells (logic cells) and the logic blocks described in the circuit diagram on the LSI chip.

(3) Step S03: Routing Interconnections Among Logic Cells/Blocks

The placement and routing unit 7 automatically routs interconnections among the terminals of the respective logic cells/blocks, based on the set placement and routing rule. At this step, the routing rule with regard to the present invention may be used.

(4) Step S04: Verifying (Checking) Placement and Routing

The placement and routing check unit 8 checks and verifies whether or not there is defects such as non-placed blocks, non-connected interconnections, the short-circuit among interconnections and the like. At this step, the routing rule with regard to the present invention may be used. If it finds a defect, the modification of the defect point and the re-execution of the placement and routing are carried out by the placement and routing check unit 8 or an input/edit unit (not shown) which belongs to the placement and routing unit 7.

(5) Step S05: Outputting Placement and Routing Result

If the placement and routing check unit 8 does not find any defect at the step S04, it converts the executed result data of the placement and routing (the data of the placement and routing system 10) into the artwork data corresponding to patterns of each layer constituting the LSI. Then, it outputs the artwork data as a placement and routing result output file 5.

The processes of the placement and routing are ended after the execution of the above-mentioned processes.

Figure 5:
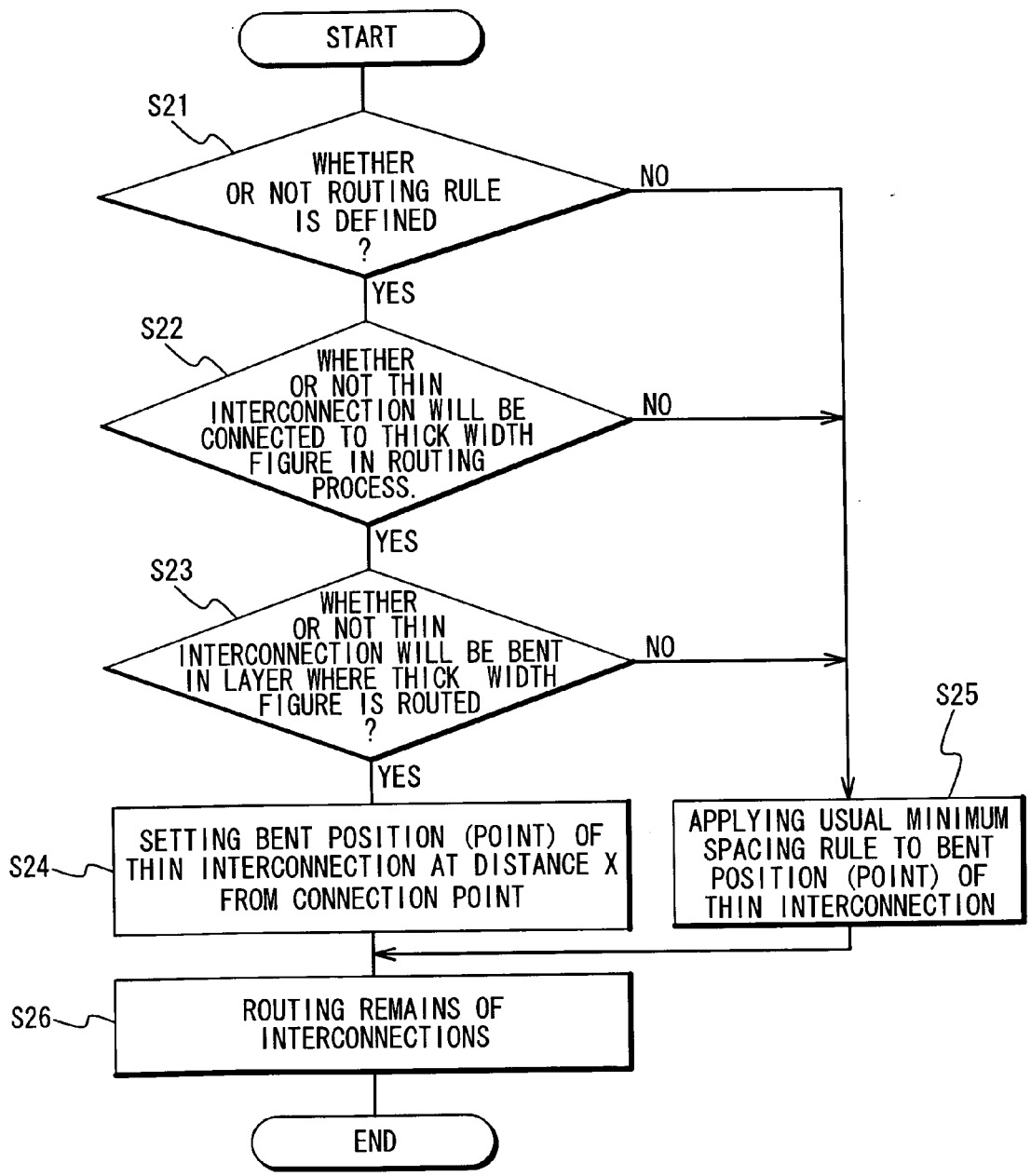
FIG. 5 is a flowchart showing the step S03 in FIG. 4.

The routing method of a semiconductor device to which the routing rule with regard to the present invention is applied at the step S03 will be described below with reference to the attached drawings. FIG. 5 is a flowchart showing the step S03 in FIG. 4.

(1) Step S21

The placement and routing unit 7 judges whether or not the predetermined design rule (the routing rule) is defined in the placement and routing rule set in the step S01. The routing rule indicates that if the thin interconnection connected to the thick width figure is bent in the layer which the thick width figure is in, the bent point should be placed at the position away from the edge portion (connection point) of the thick width figure by the predetermined distance X (distance 30) or more.

(2) Step S22

The placement and routing unit 7, if the routing rule is defined in the placement and routing rule (Step S21: Yes), judges whether or not the thin interconnection will be connected to the thick width figure in the routing process.

(3) Step S23

The placement and routing unit 7, if the thin interconnection is connected to the thick width figure in the routing process (Step S22, Yes), judges whether or not the thin interconnection will be bent in the same layer as the layer where the thick width figure is routed in the routing process.

(4) Step S24

The placement and routing unit 7, if the thin interconnection is bent in the same layer as the layer where the thick width figure is located in the routing process (Step S23: Yes), sets the bent position (point) of the thin interconnection at the distance X (distance 30) from the connection point.

(5) Step S25

The placement and routing unit 7, if the routing rule is not defined in the placement and routing rule (Step S21: No), if the thin interconnection is not connected to the thick width figure in the routing process (Step S22: No) and if the thin interconnection is not bent in the same layer as the layer where the thick width figure is located in the routing process (Step S23: No), applies the usual minimum spacing rule to the bent position (point) of the thin interconnection.

(6) Step S26

The placement and routing unit 7 automatically routs remains of the interconnections among the terminals of the respective logic cells/blocks based on the set placement and routing rule, after the above-mentioned process.

According to the present invention, the conventional routing as shown in FIG. 1 can be changed to the routing as shown in FIG. 3. Therefore, the thick width spacing area 17 is reduced, and the routing resource (routing region) is increased, and the interconnection length can be made shorter.

Figure 6:
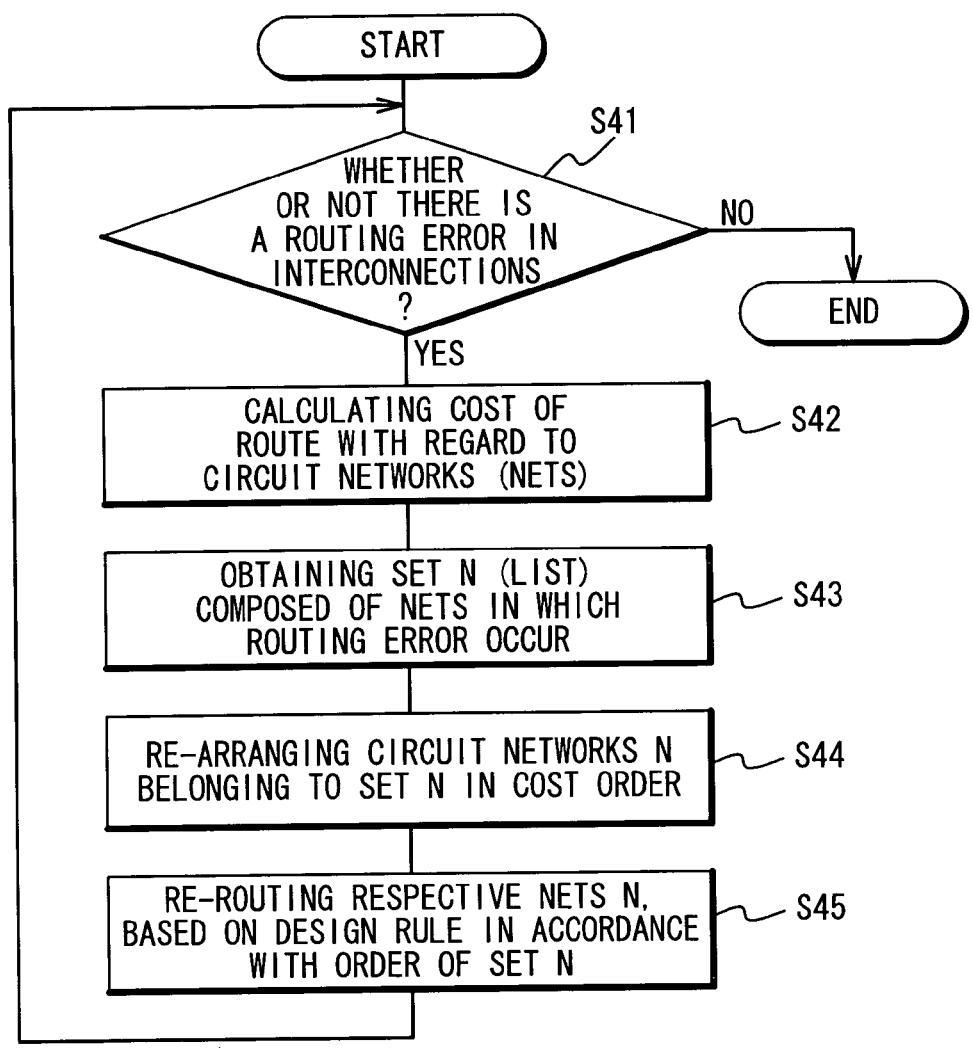
FIG. 6 is a flowchart showing the Step S04 in FIG. 4.

The routing rule with regard to the present invention may be applied at the step S04. That case will be described below with reference to the attached drawings. FIG. 6 is a flowchart showing the Step S04 in FIG. 4. Here, the flowchart with regard to the routing is indicated.

(1) Step S41

The placement and routing check unit 8 checks whether or not there is a routing error in the interconnections on which an initial routing is performed under the allowance of an error in the step S03. The design rule (the definition of the error) to be referred to at this time includes the predetermined routing rule of the present invention. The routing rule indicates that if the thin interconnection connected to the thick width figure is bent in the layer which the thick width figure is in, the bent point is placed at the position away from the edge point (connection point) of the thick width figure by the predetermined distance X (distance 30) or more. If there is no routing error, the verification (checking) of the routing in the placement and routing result is ended.

(2) Step S42

The placement and routing check unit 8 calculates the cost of the route with regard to each of circuit networks (nets) in which the routing error occurs. The cost is calculated based on the length limit of the route distance, the interconnection to be preferentially routed, the route search (the shortest route) and the like.

(3) Step S43

The placement and routing check unit 8 lists up the circuit networks (nets) in which the routing error occur and their cost. It defines the listed circuit networks as a set N.

(4) Step S44

The placement and routing check unit 8 re-arranges the circuit networks (nets) n belonging to the set N (list) in the cost order.

(5) Step S45

The placement and routing check unit 8 re-routes the respective nets n, based on the design rule (the definition of the error), in accordance with the order of the set N (list). Then, the process returns back to the step S41.

The steps S41 to S45 may be repeated until the routing error is completely removed, may be ended for a predetermined period, or may be ended after the execution of a predetermined number thereof.

Also in this case of the present invention, similarly to the case of FIG. 5, the conventional routing as shown in FIG. 1 can be changed to the routing as shown in FIG. 3. Thus, the thick width spacing area 17 is reduced, and the routing resource (routing region) is increased, and the interconnection length can be made shorter.

Any one or both of the steps S21 to S26 and the steps S41 to S45 may be executed in the routing method of a semiconductor device of the present invention.

Figure 7:
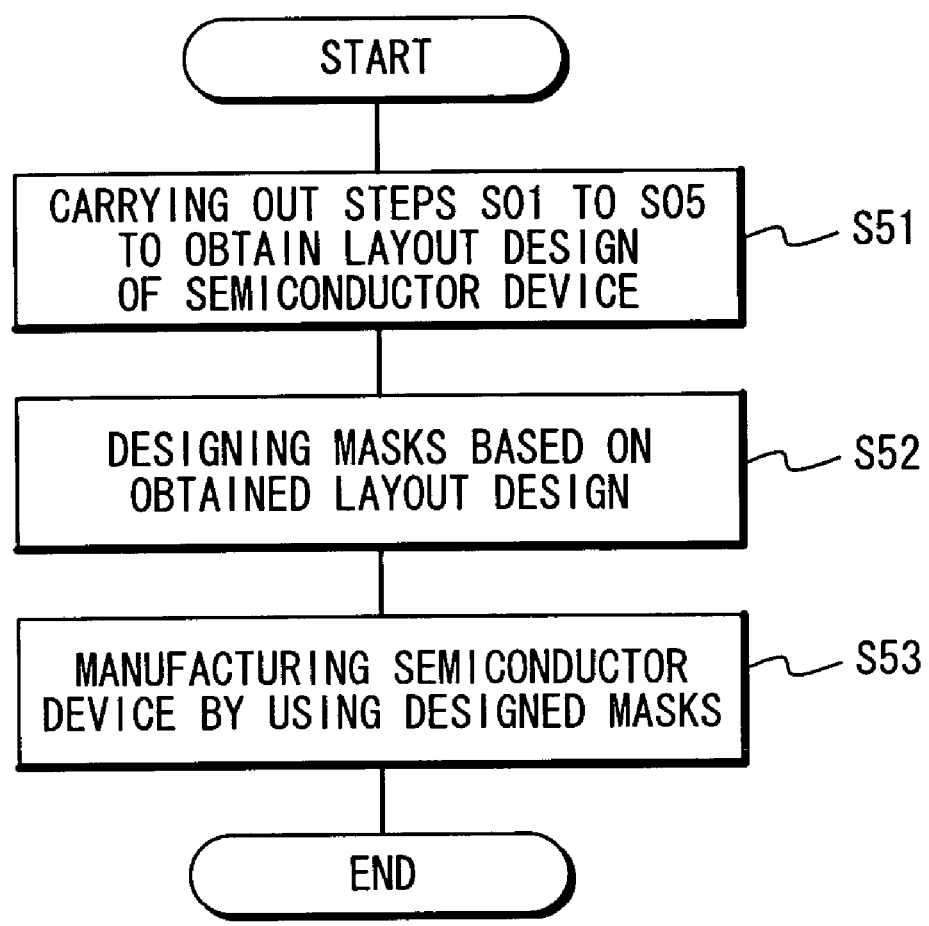
FIG. 7 is a flowchart showing the embodiment of the manufacturing method of the semiconductor device in the present invention.

The manufacturing method of the semiconductor device in the present invention will be described with reference to the attached drawings. Here, the manufacturing method uses the layout of the semiconductor device generated by the routing method of a semiconductor device in the present invention as mentioned above. FIG. 7 is a flowchart showing the embodiment of the manufacturing method of the semiconductor device in the present invention.

(1) Step S51

The above-mentioned steps S01 to S05 (including at least one of the steps S21 to S26 and the steps S41 to S45) are carried out to obtain the placement and routing result output file 5. That is, the layout design of the semiconductor device is completed by the placement and routing process for the semiconductor device.

(2) Step S52

The mask used in the semiconductor manufacturing process is designed based on the layout design in the step S51. Then, the mask is produced in accordance with the design. There is no limit on the method of designing and producing the mask in this step. Here, for example, the conventional method can be used.

(3) Step S53

The mask produced at the step S52 is used to manufacture the semiconductor device on the semiconductor substrate. There is no limit on the manufacturing process for the semiconductor device, if the above-mentioned mask is used. The methods can be used, for example, such as the conventional film forming process, lithography process and the like. The lithography process includes the step: exposing a resist film covering a film on a semiconductor substrate to light through the above-mentioned mask prepared based on the layout design in the step S51

The semiconductor device of the present invention can be manufactured as explained at the steps S51 to S53. Also in this case, the thick width spacing area 17 is reduced, and the routing resource (routing region) is increased, and the interconnection length can be made shorter. Thus, without any reduction in the reliability and stability, it is possible to increase the interconnection density and reduce the semiconductor (LSI) chip area.

What is claimed is:

1. A semiconductor device comprising:
   a first thin interconnection pattern; and
   a thick interconnection pattern which is connected with said first thin interconnection pattern at an edge of said thick interconnection pattern,
   wherein a line width of said thick interconnection pattern is thicker than that of said first thin interconnection pattern,
   said first interconnection pattern and said thick interconnection pattern is routed in a same layer, and
   said first thin interconnection pattern has a bending portion beyond a first distance from said edge;
   wherein said first distance is greater than a minimum spacing that is sufficient to protect against microloading.

2. The semiconductor device according to claim 1, further comprising:

a second thin interconnection pattern which is extended to a direction parallel to said thick interconnection pattern,
wherein said second thin interconnection pattern is routed on the nearest one of grid lines to said thick interconnection pattern,
said grid lines are predetermined for routing interconnections, and said second thin interconnection pattern is not detoured around an area corresponding to said edge and said bending portion.

3. The semiconductor device according to claim 1, wherein said first distance is a spacing for an extension from said thick interconnection pattern.

* * * * *